United States Patent
Goren et al.

(10) Patent No.: US 8,307,147 B2
(45) Date of Patent: Nov. 6, 2012

(54) INTERCONNECT AND A METHOD FOR DESIGNING AN INTERCONNECT

(75) Inventors: Ori Goren, Kibutz Ruchama (IL); Yaron Netanel, Hod-Hasharon (IL)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 12/066,229

(22) PCT Filed: Sep. 9, 2005

(86) PCT No.: PCT/IB2005/052955
§ 371 (c)(1),
(2), (4) Date: Jul. 7, 2008

(87) PCT Pub. No.: WO2007/029053
PCT Pub. Date: Mar. 15, 2007

(65) Prior Publication Data
US 2008/0307145 A1    Dec. 11, 2008

(51) Int. Cl.
*G06F 13/00* (2006.01)
(52) U.S. Cl. ..................... 710/316; 710/242
(58) Field of Classification Search .......... 710/316–317, 710/240–244
See application file for complete search history.

(56) References Cited

U.S. PATENT DOCUMENTS

| | | | |
|---|---|---|---|
| 5,189,665 A | 2/1993 | Niehaus et al. | |
| 5,349,679 A * | 9/1994 | Nakayama | 710/316 |
| 5,369,775 A | 11/1994 | Yamasaki et al. | |
| 5,388,230 A * | 2/1995 | Yamada et al. | 710/316 |
| 5,596,749 A | 1/1997 | Cantrell et al. | |
| 5,652,848 A | 7/1997 | Bui et al. | |
| 5,692,139 A * | 11/1997 | Slavenburg et al. | 710/316 |
| 5,761,449 A | 6/1998 | Sarangdhar et al. | |
| 5,796,961 A | 8/1998 | O'Brien | |
| 5,805,905 A | 9/1998 | Biswas et al. | |
| 5,857,111 A * | 1/1999 | Oda | 712/11 |
| 5,948,089 A | 9/1999 | Wingard et al. | |
| 5,968,126 A * | 10/1999 | Ekstrom et al. | 709/225 |
| 5,987,524 A * | 11/1999 | Yoshida et al. | 709/245 |
| 6,052,802 A | 4/2000 | Zahir et al. | |
| 6,058,263 A | 5/2000 | Voth | |
| 6,138,199 A * | 10/2000 | Fleischer | 710/316 |
| 6,286,083 B1 | 9/2001 | Chin et al. | |
| 6,292,705 B1 | 9/2001 | Wang et al. | |
| 6,567,885 B1 * | 5/2003 | Marmash | 710/316 |
| 6,601,126 B1 | 7/2003 | Zaidi et al. | |
| 6,611,908 B2 * | 8/2003 | Lentz et al. | 712/29 |
| 6,658,485 B1 | 12/2003 | Baber et al. | |
| 6,738,386 B1 * | 5/2004 | Holmqvist | 370/412 |
| 6,769,046 B2 * | 7/2004 | Adams et al. | 710/316 |

(Continued)

FOREIGN PATENT DOCUMENTS

EP    0706137 B1    4/1996

(Continued)

*Primary Examiner* — Paul R Myers

(57) ABSTRACT

A method for designing an interconnect, the method includes determining an amount of input ports, an amount of output ports; characterized by selecting multiple modular components such as to form an interconnect, whereas each modular component is selected from a group of modular components that are verified by parametric verification environment. An interconnect that includes multiple input ports and multiple output ports, characterized by including multiple modular components; whereas each modular component is adapted to support a certain point-to-point protocol; whereas at least one modular component includes a sampling circuit and a bypass circuit, whereas the sampling circuit is selectively bypassed by the bypass circuit.

20 Claims, 14 Drawing Sheets

U.S. PATENT DOCUMENTS

| | | | |
|---|---|---|---|
| 6,804,758 B2 | 10/2004 | Liao et al. | |
| 6,845,461 B1 * | 1/2005 | Kim | 713/500 |
| 6,880,028 B2 * | 4/2005 | Kurth | 710/240 |
| 6,912,612 B2 * | 6/2005 | Kapur et al. | 710/309 |
| 6,954,821 B2 * | 10/2005 | Fitzsimmons et al. | 710/317 |
| 7,039,750 B1 * | 5/2006 | Regula et al. | 710/317 |
| 7,051,150 B2 * | 5/2006 | Naumann et al. | 710/317 |
| 7,076,595 B1 * | 7/2006 | Dao et al. | 710/317 |
| 7,114,041 B2 * | 9/2006 | Hammitt et al. | 711/149 |
| 7,117,287 B2 * | 10/2006 | Smith | 710/310 |
| 7,130,946 B2 * | 10/2006 | Abhay et al. | 710/242 |
| 7,231,478 B2 * | 6/2007 | Leijten | 710/242 |
| 7,324,541 B2 * | 1/2008 | Muthukrishnan et al. | 370/429 |
| 7,412,551 B2 * | 8/2008 | Bose et al. | 710/120 |
| 7,496,700 B1 | 2/2009 | Chong et al. | |
| 8,078,781 B2 | 12/2011 | Goren et al. | |
| 2003/0005344 A1 * | 1/2003 | Bhamidipati et al. | 713/400 |
| 2003/0135675 A1 | 7/2003 | Pontius et al. | |
| 2004/0010652 A1 | 1/2004 | Adams et al. | |
| 2004/0210694 A1 | 10/2004 | Shenderovich | |
| 2004/0243752 A1 | 12/2004 | O'Connor et al. | |
| 2006/0209879 A1 * | 9/2006 | Suganuma | 370/460 |
| 2010/0169525 A1 | 7/2010 | Natanel et al. | |

FOREIGN PATENT DOCUMENTS

| | | |
|---|---|---|
| GB | 2341772 A | 3/2000 |
| JP | 04299436 | 10/1992 |
| JP | 2005004736 | 1/2005 |

* cited by examiner

1500

INTERCONNECT AND A METHOD FOR DESIGNING AN INTERCONNECT

FIELD OF THE INVENTION

The present invention relates to interconnects and to methods for designing interconnects.

BACKGROUND OF THE INVENTION

On-chip interconnects connect various components of an integrated circuit. In modern integrated circuit these interconnects usually are used to connect multiple masters (components that are capable of initiating memory transactions) to multiple slaves (components that are capable of responding to memory transactions).

There are various types of interconnects, including ordered split (or non-split) transaction interconnects, blocking and non-blocking interconnects, full fabric and partial fabric interconnects, and the like. An interconnect is also characterized by its latency and throughput.

The designers of modern interconnects are required to tailor the interconnects to different masters and slaves, and to complete the design of the interconnects during short design periods.

These masters and slaves can differ by the nature of the transaction they support. This includes different pipeline depth, burst size, clock frequency, address alignment, wrap-around capability for critical word first, etc.

In addition, a modern interconnect has to operate in high frequencies, to compensate for the delay introduced by relatively long routes, as well as to consume a moderate amount of power.

There is a need to provide an efficient interconnect and a method for designing an interconnect.

SUMMARY OF THE PRESENT INVENTION

An interconnect and a method for designing interconnects, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

The invention provides a scalable interconnect, and a design method that uses modular components that can form an interconnect. The usage of modular components speeds up the verification and design period.

Especially, the interconnect is non tri-state fully synthesizable design that reduces chip level circuit verification effort.

Conveniently, a group of interconnects are designed by receiving the masters and slaves to be connected by the group of interconnects, grouping the masters and slaves to groups of components, in order to fulfill various requirements (such as but not limited to latency requirements), and designing an interconnect to each group of components, as well as interconnecting between the different interconnects of the group. Conveniently, a latency sensitive group of components is interconnected by a latency sensitive interconnect.

Conveniently, the parameters of the modular components are determined in response to the characteristics of at least one master or slave. Usually the parameters are tailored to the pair of slave and master that should be serviced with the lowest latency. Conveniently, the bus width of the components of the interconnect fit the bus width of a processor, but this is not necessarily so.

Conveniently, the parameters of the modular components can be selected such as to minimize the number of bus width adaptors, clock separators and the like.

Conveniently, the interconnect includes multiple sampling circuits that can be selectively bypassed. The selective bypass allows to use the same design to different frequency domains that require different latency. The selective bypass can be controlled by various control signals, by programmable or non-programmable plugs, and the like. The selection can also amount in the exclusion of bypassed sampling circuits during the design stage.

Conveniently, the interconnect solves timing problems by including sampling circuits or modular sampling components. The latency penalties introduced by the sampling circuit or components is compensated by supporting a deep pipeline. The modular components can receive data or control signals from a master and release that master while propagating the data and control signals within the interconnect.

Figure 1:
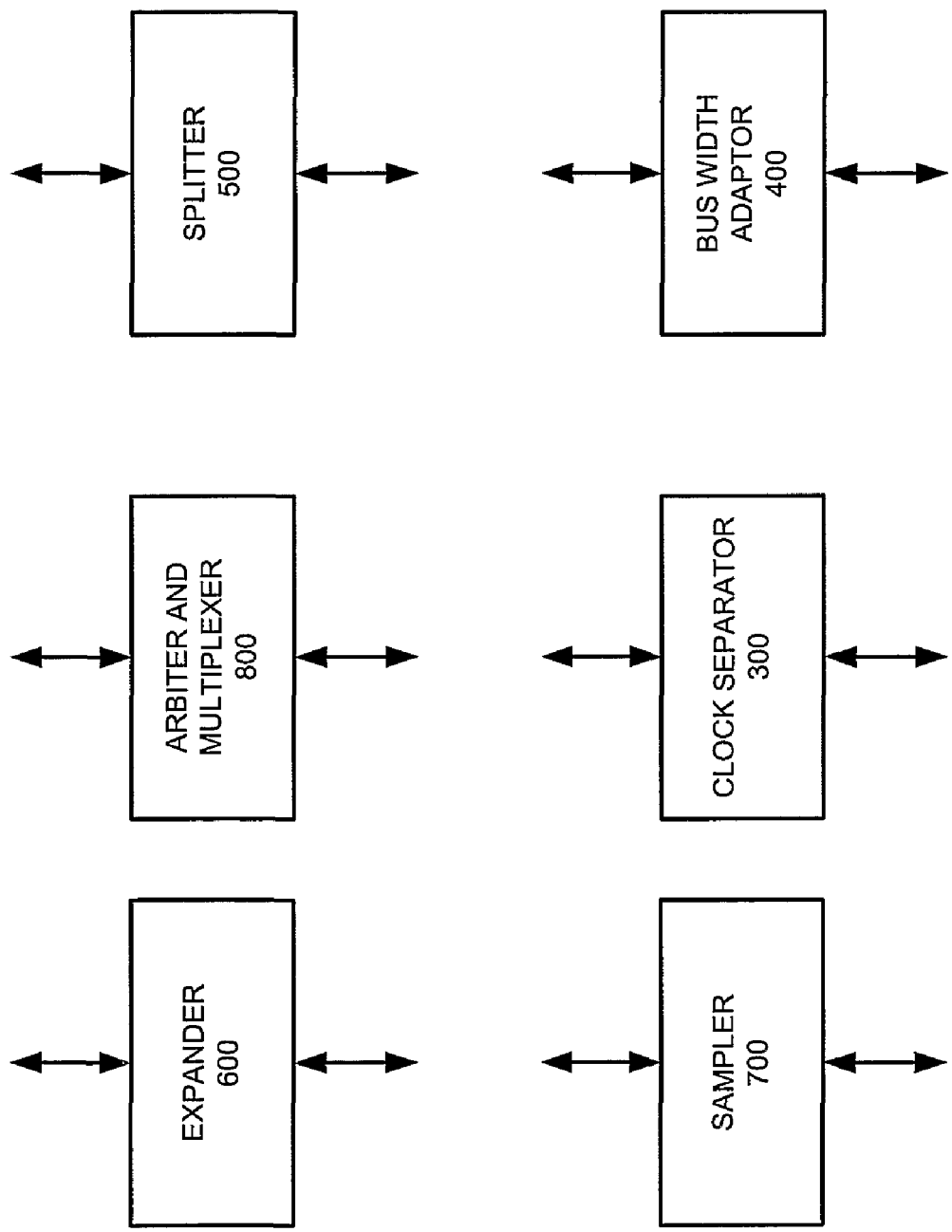
FIG. 1 illustrates modular components of an interconnect, according to an embodiment of the invention.

FIG. 1 illustrates the modular components 300-800 of an interconnect, according to an embodiment of the invention.

Conveniently, the modular components include: (i) expander 600, (ii) arbiter and multiplexer 800, (iii) splitter 500, (iv) sampler 700, (v) clock separator 300, and (vi) bus width adaptor 400.

It is noted that an interconnect does not necessarily include all these components. It is further noted that these components can also be used as stand-alone components in the integrated circuit. Those of skill in the art will appreciate that an inter connect can include multiple stages of these modular components.

According to an embodiment of the invention each of these modular components building blocks is using the same standard interface, such as to facilitate a glue-less connection between each of these components.

According to another embodiment of the invention each modular components can alter various attributes of various pending transaction requests. For example, various transaction requests can be associated with an arbitration priority that can be upgraded. Each modular component can upgrade the priority of the transaction request it stores, either in response to a request from another component or even apply a time based priority upgrade scheme.

Conveniently, at least one modular component can receive and generate signals that represent the beginning and/or end of the following phases: request and address phase, a data phase and an end of transaction phase.

Conveniently, at least one modular component can store one or more transaction request and also support multiple pending transaction requests that are stored in other components. For example, the expander 600 can receive up to sixteen transaction requests that were not followed by data phases and/or end of transaction phases, although it can store a more limited amount of requests.

Expander 600 allows a single master with a point-to-point interface to access a plurality of slaves, each with a point-to-point interface. The slave selection is based upon address decoding. Arbiter and multiplexer 800 allows a plurality of masters with a point-to-point interface to access a single slave with a point-to-point interface.

Splitter 500 allows a single master with a point-to-point interface to access a single slave with a point-to-point interface. The splitter 500 optimizes transactions according to the capabilities of the slave.

Sampler 700 allows a single master with a point-to-point interface to access a single slave with a point-to-point interface. It samples the transactions generated towards the slave. It is noted that the sampler 700 as well as other components can include one or more sampling circuits and optionally one or more bypassing circuit.

Clock separator 300 allows a single master with a point-to-point interface to access a single slave with a point-to-point interface. The master may operate in one clock domain while the slave operates in another clock domain. Bus width adaptor 400 allows a single master with a point-to-point interface to access a single slave with a point-to-point interface. The master's data bus width is different than the slave's data bus width.

Conveniently, each modular component out of components 200-800 includes an input interface and an output interface. For convenience of explanation these interfaces were illustrated only in FIG. 7 (input interface 305 and output interface 315) and in FIG. 8 (input interface 205 and output interface 215).

Figure 4:
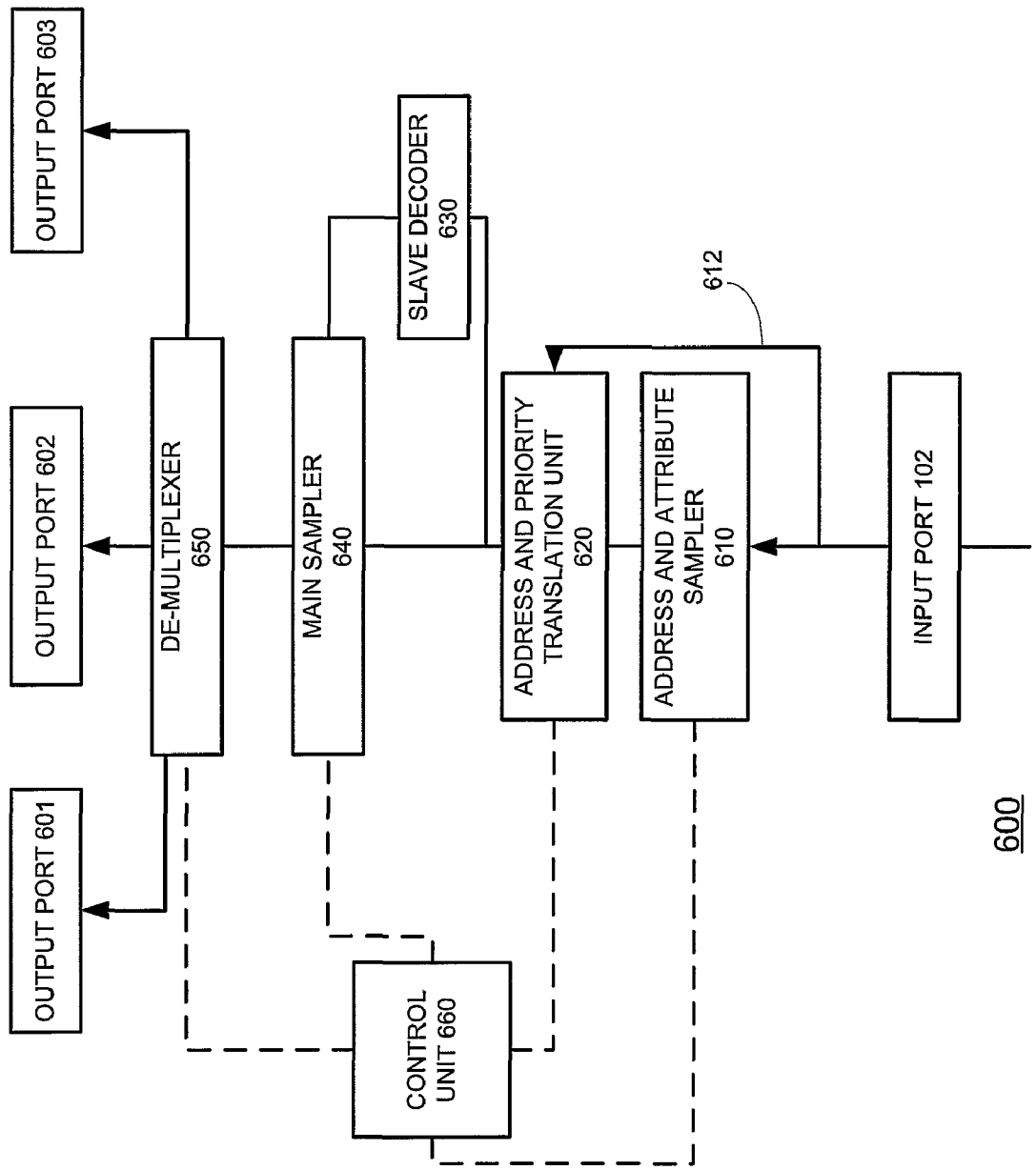
FIG. 4 illustrates an expander, according to an embodiment of the invention.

According to an embodiment of the invention multiple modular components out of components 200-800 includes a sampling circuit that can be selectively bypassed by a bypass circuit. For convenience of explanation only FIG. 4 illustrates a sampling circuit 610 and a bypass circuit 612.

Figure 2:
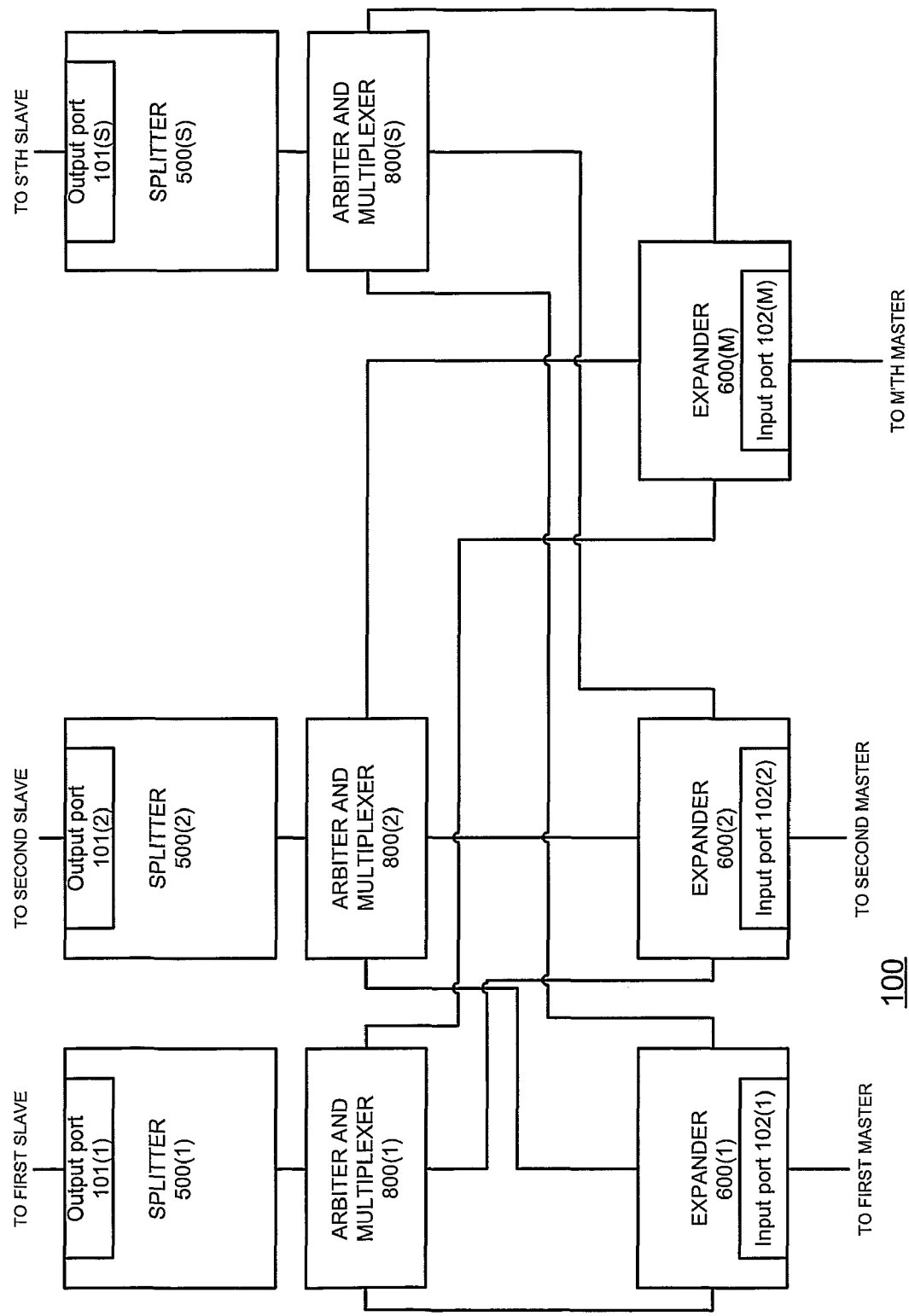
FIG. 2 illustrates an interconnect, according to an embodiment of the invention.

FIG. 2 illustrates an interconnect 100, according to an embodiment of the invention.

Interconnect 100 connects between M masters and S slaves. M and S are positive integers. The M masters are connected to M input ports 102(1)-102(M) while the S slaves are connected to output ports 101(1)-101(S). These input and output ports can support bi-directional traffic between masters and slaves. They are referred to input and output ports for convenience only. Conveniently, the input ports 102(1)1-102(M) are the input interfaces of the expanders 600(1)-600(M) and the output ports are the output interfaces of splitters 500(1)-500(S).

Interconnect 100 includes M expanders 600(1)-600(M), S arbiters and multiplexers 800(1)-800(S) and S splitters 500(1)-500(S). Each expander includes a single input port and S outputs, whereas different outputs are connected to different arbiter and multiplexers.

Each arbiter and multiplexer 800 has a single output (that is connected to a single splitter) and M inputs, whereas different inputs are connected to different expanders 600. Each splitter 500 is connected to a slave.

It is noted that interconnect 100 can have different configuration than the configuration illustrated in FIG. 2. For example, it may include multiple samplers 700, clock separators 300 and bus width adaptors 400. These components can be required in order to support interconnects to slaves and masters that have different bus widths and operate in different frequencies.

Each splitter 500 is dedicated to a single slave. This splitter 500 can be programmable to optimized the transactions with that slave. Conveniently, each splitter 500 is programmed according to the slave maximal burst size, alignment and critical-word-first (wrap) capabilities.

Interconnect 100 can operate as a low latency interconnect by utilizing the minimal amount of sampling circuits and bypassing other sampling circuits. It can also operate as latency insensitive interconnect.

Conveniently, 100 is a non-blocking full fabric switch that supports per-slave arbitration, thus it enables maximal data bus utilization towards each of the slaves.

Each modular components of the interconnect 100 has a standard, point to point, high performance interface. Each master and slave is interfaced via that interface. These interface uses a three phase protocol. The protocol includes a request and address phase, a data phase and an end of transaction phase. Each of these phases is granted independently. The protocol defines parking grant for the request and address phase. The data phase and the end of transaction phase are conveniently granted according to the fullness of the buffers within the interconnect 100. The request is also referred to as transaction request. The end of transaction phase conveniently includes sending an end of transaction (EOT) indication.

For example, a master can send a write transaction request to an expander 600(1). The expander 600(1) can store up to three write transaction requests, but can receive up till sixteen write transaction requests, as multiple transaction requests are stored in other components of the interconnect. Thus, if it received the sixteenth write transaction request (without receiving any EOT or EOD signal from the master) it sends a busy signal to the master that should be aware that it can not send the seventeenth transaction request.

On the other hand, when the expander 600(1) stores the transaction request it sends an acknowledge to the master that can enter the data phase by sending data to the expander 600(1). Once the expander 600(1) ends to receive the whole data it sends a EOD signal to the master that can then end the transaction.

The expander 600(1) sends the transaction request to the appropriate arbiter and multiplexer. When the transaction request wins the arbitration and when the multiplexer and arbiter receives a request acknowledge signal then expander 600(1) sends the data it received to the splitter. Once the transmission ends the expander 600(1) enters the end of transaction phase. The splitter then executes the three-staged protocol with the target slave.

Interconnect 100 can use multiple sampling circuits, in order to interconnect between high frequency masters and remote slaves. The amount of sampling units affects the depth of the pipeline although the depth of the pipeline can be also responsive to other parameters such as but not limited to the buffering capabilities of the interconnect 100, and the like. The amount of sampling circuits can be increased by adding samplers, such as sampler 700 to interconnect 100, and/or by bypassing or not-bypassing the sampling circuitries within the expanders, arbiters and multiplexers and the splitters. For example, the expander 600 includes a main sampler 640 as well as an address and attribute sampler 610 that can be bypassed.

Conveniently, interconnect 100 can terminate write transaction locally or let it be terminated by the slave. The write termination capability is enables by an attribute that is associated with the transaction. In order to provide data coherency the slave should terminate the write transaction, otherwise the interconnect 100 can terminate the transaction locally.

Conveniently, the interconnect 100, and especially each arbiter and multiplexer 800 implements an arbitration scheme that can be characterized by the following characteristics: multiple (such as four) quality-of-service (or priority) levels, a priority upgrade mechanism, priority mapping, pseudo round robin arbitration, time based priority level upgrade, priority masking, weighted arbitration, and late decision arbitration.

The priority level is an attribute of each transaction. The arbiter includes a dedicated arbiter circuit per priority level. The priority upgrade mechanism allows a master (or another component) to upgrade a priority level of a pending transaction, based upon information that is acquired after the generation of that transaction request. The upgrade involves altering the priority attribute associated with the transaction request. The update can be implemented by the various components of the interconnect.

According to an embodiment of the invention some transaction requests can be labeled as non-upgradeable, while other transaction requests can be labeled as upgradeable. Non-upgradeable transaction requests are not upgraded during priority upgrade sessions.

Priority mapping allows to map master priority levels to slave priority levels or to a common priority level mapping. Pseudo round-robin arbitration involves storing the last arbitration winner and scanning a transaction request vector from the last arbitration winner until a current transaction request is detected.

Time based priority level upgrading includes updating the priority level of pending transaction requests in response to the time they are pending. Conveniently, this feature reduces the probability of starvation. According to an embodiment of the invention a predefined timing threshold T1 is defined. When half of T1 passes the priority level is upgraded. When another fourth of T1 passes the priority level is further upgraded. When another eighth of T1 passes the priority level if further upgraded. Those of skill in the art will appreciate that other time based priority level upgrading schemes can be applied without departing from the scope of the invention.

Priority masking includes selectively masking various request of predefined priorities, during predefined time slots. Conveniently, during one time slot the highest priority transaction requests are masked, during another timeslot the highest and the second highest priority transactions requests are blocked, and so on. Conveniently, some transaction requests can not be blocked, and during various time slots all the transaction requests are allowed. This guarantees a minimal arbitration winning slots for transactions with lower priorities, thus resolves potential starvation problems.

Weighted arbitration includes allowing an arbitration winner to participate in multiple consecutive transactions (transaction sequence) after winning an arbitration session. The weight can represent the amount of transactions that can be executed by an arbitration winner. Conveniently, if during the transactions sequence a higher priority transaction request wins the arbitration scheme then the transaction sequence stops.

Late decision arbitration includes determining a new arbitration winner substantially at the end of a currently executed transaction or substantially after a delay corresponding to the length of the current transaction ends.

Interconnect 100 is an ordered interconnect thus is does not require area-consuming re-order buffers. Conveniently, interconnect 100 is synthesized within a bounded centralized area generating star topology. This synthesis may require to add a small amount of buffers between interconnect 100 and the master and slayer that are connected to it. Nevertheless, this synthesis dramatically reduces the complexity of routing and further shortens the design and verification period.

Interconnect 100 has a relatively small area resulting in relatively low static power consumption. In addition, by applying power gating techniques the power consumption of interconnect 100 is further reduced.

Interconnect 100 includes multiple point-to-point interfaces (also referred to ports) that inherently implement sampling. In addition interconnect 100 includes multiple sampling circuits that can be selectively bypassed, thus preventing low frequency filtering problems arising from long paths.

Interconnect 100 supports an ordered transaction protocol. In addition, to simplify implementation and eliminate reorder buffers, interconnect 100 does not generate transaction towards a new slave till all pending transaction towards that slave are completed. This behavior ensures that the order of transaction completion is the same of the order of transaction initiated. As a result the actual latency towards a certain slave may increase due to additional stall cycles.

According to another embodiment of the invention interconnect 100 includes a relatively limited reorder mechanism that does not require to stall a transaction towards one slave until a previous transaction towards that slave is completed.

Figure 3:
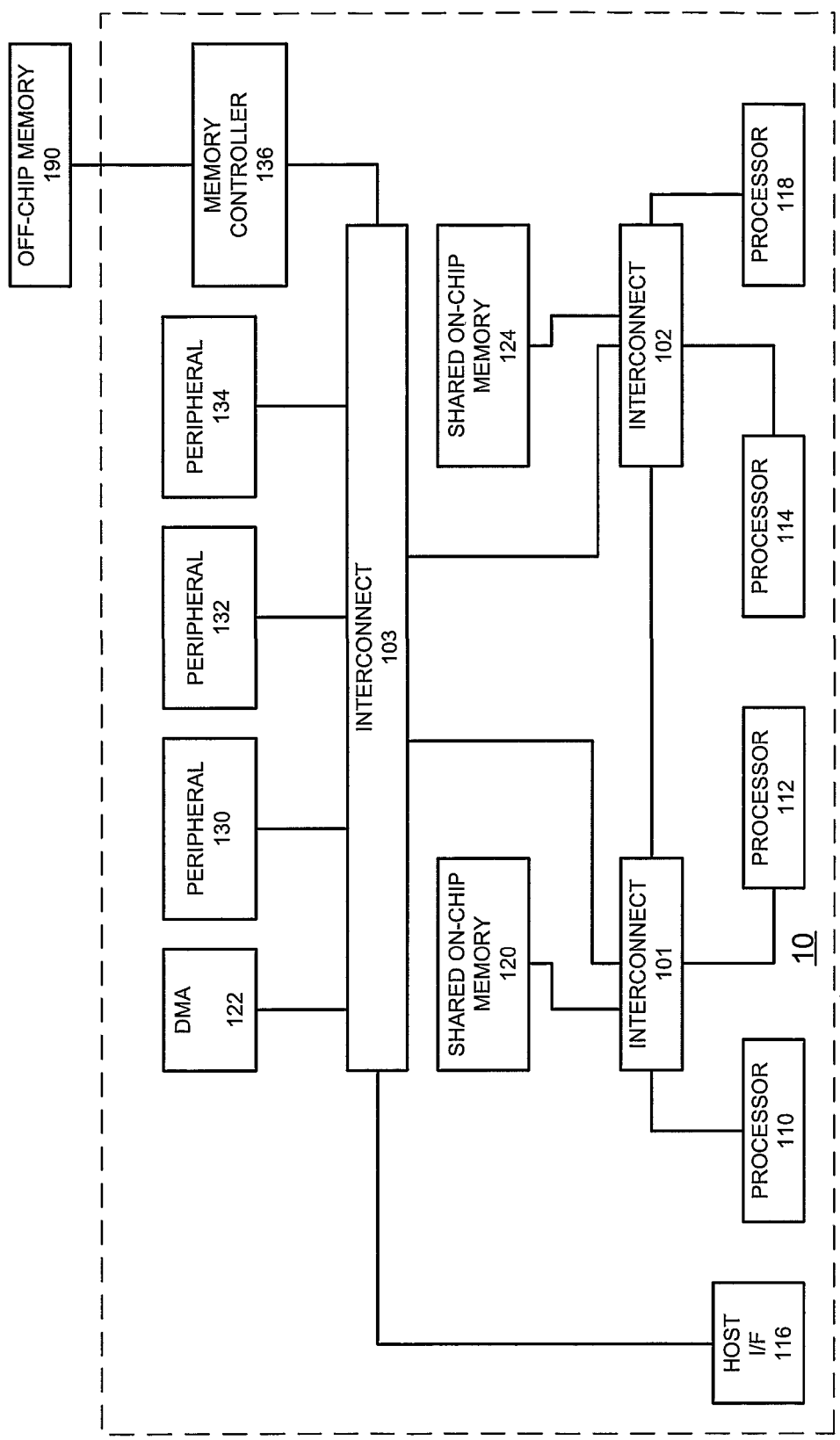
FIG. 3 illustrates an integrated circuit, according to an embodiment of the invention.

FIG. 3 illustrates an integrated circuit 10, according to an embodiment of the invention.

Integrated circuit 10 includes a group of interconnects that includes interconnects 101, 102 and 103. The usage of multiple interconnects can be required when certain components should be connected by a low latency interconnect. If a single interconnect can not provide such low latency then the components of the integrated circuit can be grouped to multiple groups. At least one group includes multiple components that are physically close to each other that are interconnected by a low latency interconnect. Interconnects 101 and 102 are low latency interconnects while interconnect 103 is a latency insensitive interconnect. Conveniently, more sampling circuits are bypassed at interconnects 101 and 102 in comparison to interconnect 103.

Interconnect 101 interconnects a first group of components that includes processors 110 and 112 and shared on-chip memory 120. Interconnect 101 is also connected to interconnect 102 and interconnect 103. The two processors 110 and 112 are the masters of this interconnect.

Interconnect 102 interconnects a second group of components that includes processors 114 and 118 and shared on-chip memory 124. The two processors 114 and 118 are the masters of this interconnect.

Interconnect 103 interconnects a third group of components that includes DMA 122, external host interface (I/F) 116, peripherals 130, 132 and 134 and a memory controller 136. The memory controller 136 is connected to an off chip memory 190. Peripherals 130, 132 and 134 and memory controller 136 are the slaves of interconnect 103.

FIG. 4 illustrates an expander 600, according to an embodiment of the invention.

Expander 600 includes input port 102, multiple (such S) output ports 601-603, an address and attribute sampler 610, an address and priority translation unit 620, slave decoder 630, main sampler 640, de-multiplexer 650 and control unit 660.

The address and attribute sampler 610 can be bypassed. If it is not bypassed it samples the address and attributes lines.

Expander 600 supports priority upgrades of transaction requests that are stored in it. Thus, a priority attribute of a stored transaction request can be updated. The updated priority is taken into account by arbiters and multiplexers 800(1)-800(S). The upgrade can usually take place before the slave that is the target of the transaction acknowledges the transaction request.

The main sampler 640 includes a double buffer for all lines from the master to the slave (including address, write data and attribute lines). The double buffer allows to sample address, write data and attribute lines of a certain transaction before another transaction ends. The main sampler 640 provides a single buffer for the lines from the slave to the master (including, for example, read data).

The main sampler 640 facilitates transaction priority upgrading and also time based priority upgrading. Time based priority upgrade involves increasing a priority of a pending transport request that is pending for more than a certain time threshold. Conveniently, multiple transaction priority upgrades can occur if the pending period exceed multiple time thresholds.

The priority upgrading is conveniently initiated by a master and includes upgrading the priority of a certain pending transaction request (by altering the priority attribute). Conveniently, the priority attribute of other transaction requests that precede that certain transaction requests are also upgraded. This feature allows to maintain the order of requests while increasing the probability that a certain pipelines transaction request will be serviced before lower priority transaction requests. Conveniently, the controller 660 can control this priority upgrade, but this is not necessarily so.

The address and priority translation unit 620 translates the upper bits of the address according to a predefined values. The priority translation involves translating master transaction priority levels to a slave transaction priority levels to common priorities levels. The translation can involve using a predefined transaction priority lookup table.

The slave decoder 630 receives an address over address lines and determines whether the transaction is aimed to a slave out of the S slaves that are connected to the interconnect or if the address is erroneous, based upon a predefined address range that is associated with each slave.

According to one embodiment of the invention the address ranges that are allocated to each slave are unique so that only one slave can be selected. According to another embodiment of the invention the address ranges overlap but additional information such as slave priority are provided in order to resolve multiple matches between an input address and different address ranges.

Conveniently, the address ranges are stored in address registers located within the expander 600. Typically one address register stores the start address of the address range while the other address register stores the end address of the address range or an offset from the start address.

The de-multiplexer 650 sends data, address and attribute signals to the arbiter and multiplexer 800 that is connected, via a splitter 500, to the target slave.

The control unit 660 control the operation of the address and attribute sampler 610, address and priority translation unit 620, slave decoder 630, main sampler 640 and the de-multiplexer 650. The control unit 660 can control power gating techniques, and block transaction requests aimed to a certain target slave until a current transaction that is aimed to that certain target slave is completed. The transaction completion can be indicated by an end of transaction signal that is sent from the target slave.

Conveniently, the control unit 660 includes an access tracker, request generator, end of data indication generator and a transaction type tracking circuitry. The access tracker tracks transactions that did not end. The request generator sends transaction request signals towards target slaves. The end of data indication generator sends EOD indication towards the master. The transaction type tracking circuitry stores information that indicates the type (read, write, error, idle) of transactions that are currently during their data phase.

Figure 5:
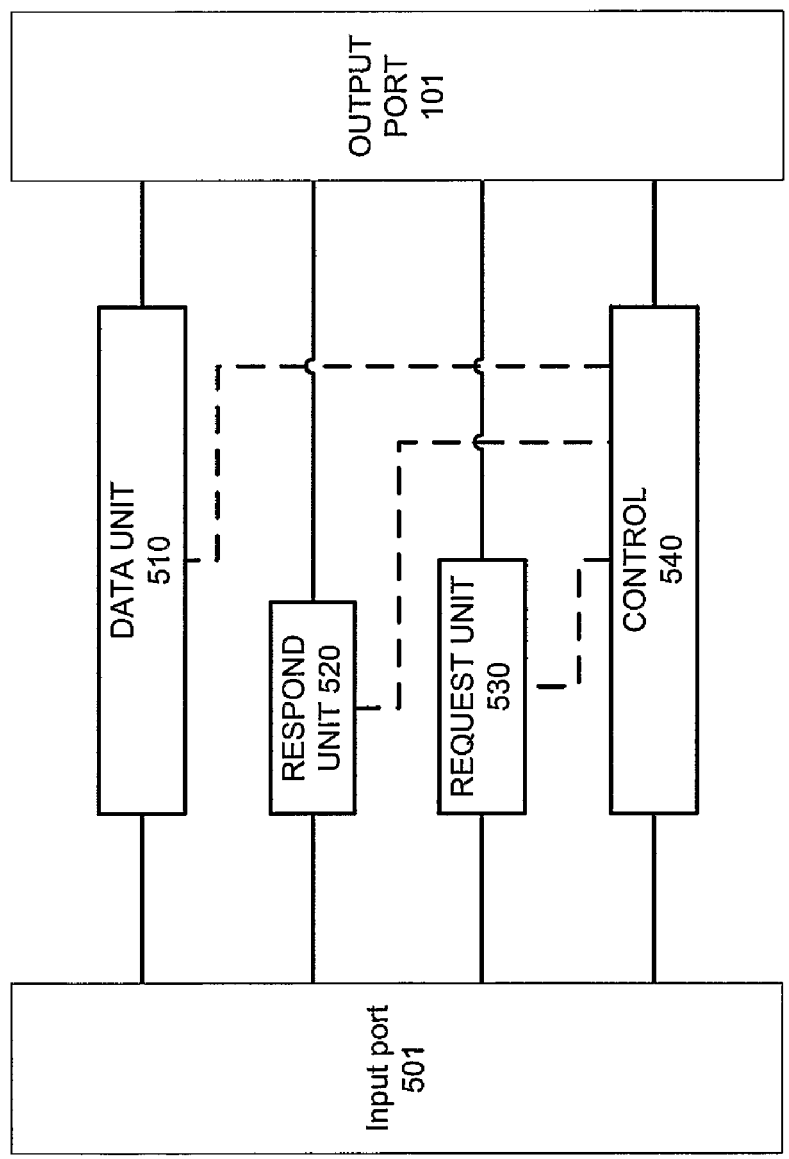
FIG. 5 illustrates a splitter, according to an embodiment of the invention.

FIG. 5 illustrates a splitter 500, according to an embodiment of the invention.

Splitter 500 is adapted to receive data transactions from the master and convert them to one or more transactions towards the slave, and vice verse. The splitter 500 stores various slave transaction characteristics (also referred to as attributes), such as maximal burst size, data burst alignment, wrap size, and the like. It then defines the translations towards the slave in response to these attributes. The splitter 500 also applies the three stage protocol towards the slave and towards the master. For example, if a master sends a data burst of 128 bits and the slave can receive data bursts of 32 bits then the splitter 500 converts this data burst to four slave data bursts.

The splitter 500 can be configured to be responsive to the slave transaction attributes (optimize mode) or as a sampling stage (sampler mode). In the sampler mode the splitter 500 only samples signals and sends them towards the slave. It is noted that the bus width of the input port and output port of the splitter 500 are the same, thus sampling mode can be easily executed.

The splitter 500 includes a data unit 510, a respond unit 520, a request unit 530 and a control/debug unit 540. The control/debug unit 540 controls the splitter and is also used during debug mode.

It is noted that other modular component of interconnect 100 includes a debug unit and/or a combined debug and control unit but for simplicity of explanation only FIG. 5 illustrates a debug unit.

The data unit 510 includes buffers that enable to exchange data between the master and slave. The respond unit 520 manages the end of transmission signal and the end of data signals. The request unit 530 performs the access optimization and manages other control signals.

The splitter 500 can store multiple transaction requests, and includes one sampling circuit as well as an optional sampling circuit that can be bypassed. The second sampling circuit is located within the request unit 530. Conveniently, two sampling circuits are activated when the splitter 500 wrap is enabled, or when the splitter 500 operates in an optimize mode.

Conveniently, when a write transaction occurs, the master sends a data burst to the splitter 500. The master also sends information reflecting the size of the burst, so that the splitter 500 can send an EOD signal towards the master once it received the whole data burst and the master-splitter data phase ends. It can also send an EOT signal once the master-splitter end of transaction phase ends. The EOD and EOT can be sent even if the data was not sent (or was not completely sent) to the slave. The splitter 500 sends data to the slave in one or more data beats, and used the three stage protocol. The slave sends to the splitter 500 EOD and EOT signals once the splitter-slave data phase and the splitter-slave transaction end phase are completed.

According to an embodiment of the invention the splitter 500 can also support transaction priority upgrading and also time based priority upgrading. These features can be required if the splitter 500 is followed by an arbiter.

Figure 6:
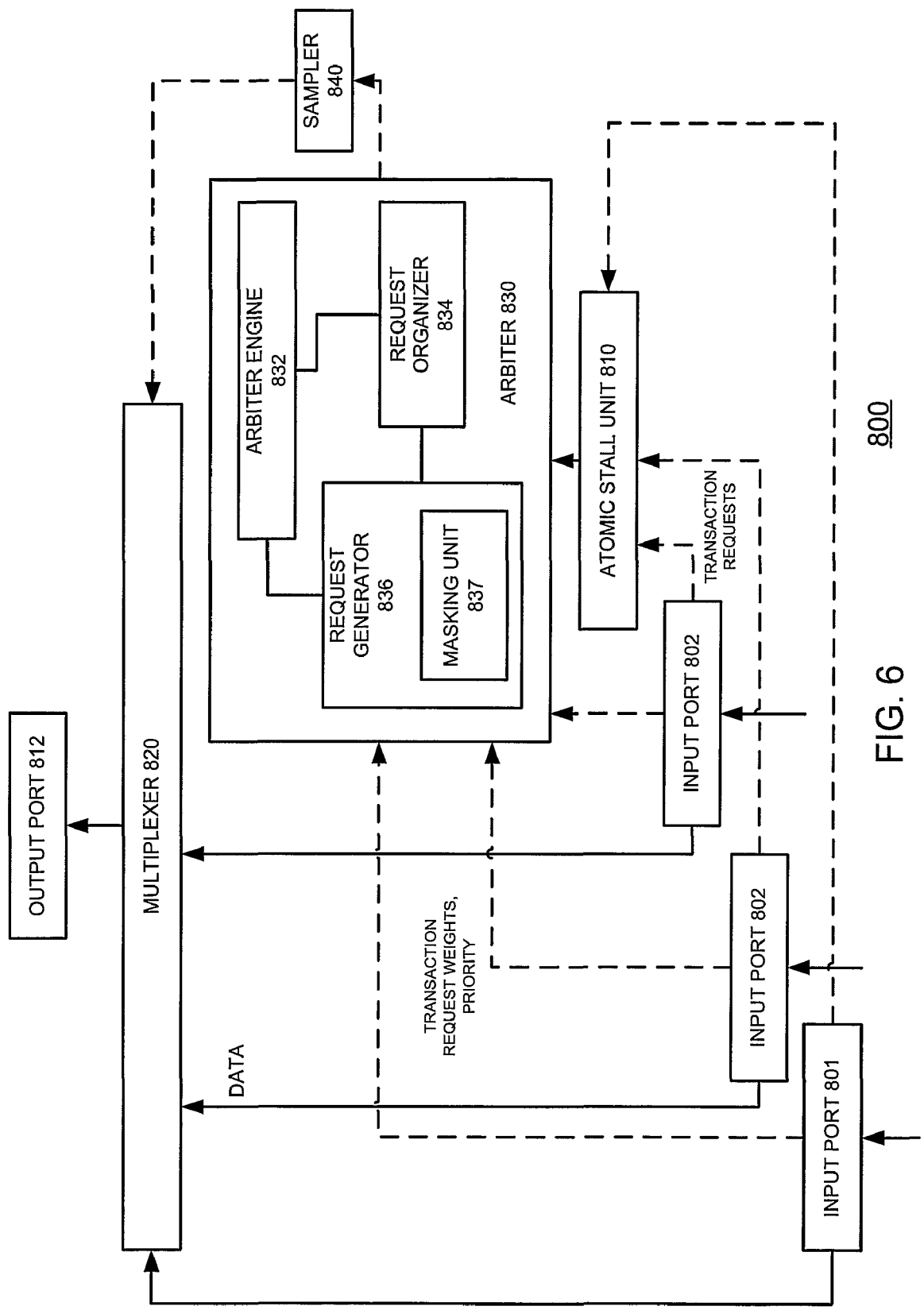
FIG. 6 illustrates multiplexer and arbiter, according to an embodiment of the invention.

FIG. 6 illustrates multiplexer and arbiter 800, according to an embodiment of the invention.

Multiplexer and arbiter 800 includes multiple (such as M) input ports 801-803, output port output ports 812, an atomic stall unit 810, multiplexer 820, arbiter 830 and sampler 840. The atomic stall unit 810 receives transaction requests from various masters that are aimed to the same slave. Sampler 640 samples the arbitration result. It is connected between the multiplexer 820 and the arbiter 830.

The arbiter 830 receives the transaction requests from the atomic stall unit 810, master arbitration priority and master weights, a late arbitration control signal, and provides to the multiplexer 820 the arbitration winner and an indication that a transaction starts. The transaction start indication is responsive to a transaction acknowledgement signal sent from the splitter. The multiplexer 820 also receives the transaction requests and in response to the control signal from the arbiter 830 selects one of the pending transaction requests to be outputted to the splitter 500.

The arbiter 830 includes an arbiter engine 832, a request organizer 834 and a request generator 836.

The request organizer 834 receives the transaction requests and their priority level and generates multiple request vectors, each vector represents the transaction requests that belong to a certain priority level. Each vector indicates the masters that sent pending transaction requests.

The request generator 836 includes a masking unit 837 that selectively masks various transaction request of predefined priorities, during predefined time slots. For example, assuming that four priority levels exist, and that sixteen timeslots are defined. During two time slots the highest priority transaction requests are masked and the corresponding request vector is null. During two other time slots the two highest priority transaction requests are masked and the two corresponding request vectors are null. During one time slot only the lowest priority level transaction requests are enabled and during the other time slots all the transaction requests are unmasked.

The request generator 836 also applies the weighted arbitration and the late decision arbitration, by sending to the arbiter engine 832 timing signals that indicate when to perform an arbitration cycle. For example, the request generator can receive an indication about the size of a data burst and the size of the data beat and determine when to trigger the next arbitration cycle. The request generator 836 is aware of the priorities of the pending transaction requests and can request an arbitration cycle if a higher priority request has arrived during a long transaction of a lower priority transaction request.

The request generator 826 also sends control signals such as master request signal and slave acknowledge signal in order to implement the three phase protocol.

The arbiter engine 832 includes multiple arbitration circuits, each associated with transaction requests that belong to the same priority level. The arbitration winner is the highest unmasked transaction request that won an arbitration cycle within the arbitration circuit.

The arbiter engine 832 receives multiple request vectors, each vector represents the transaction requests that belong to a certain priority level. Each vector indicates the masters that sent pending transaction requests. The arbiter engine 832 applies a pseudo round robin arbitration scheme, that takes into account only the winner of the last arbitration cycle.

Those of skill in the art will appreciate that other arbitration schemes, including well know arbitration schemes can be applied.

Figure 7:
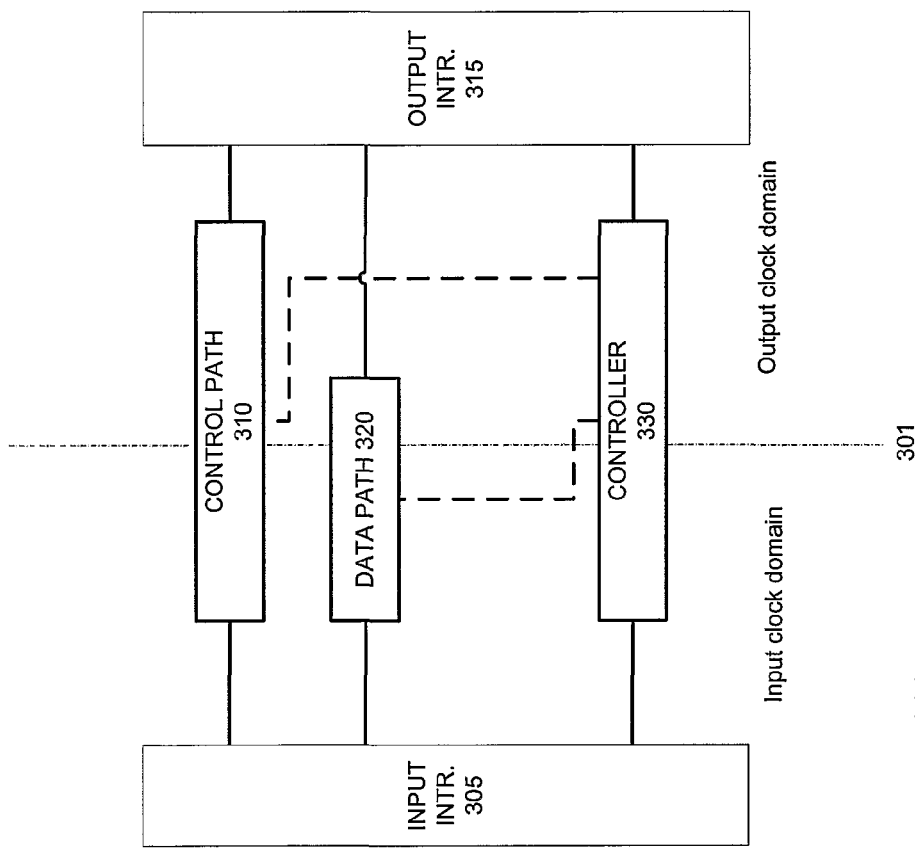
FIG. 7 illustrates a clock separator, according to an embodiment of the invention.

FIG. 7 illustrates a clock separator 300, according to an embodiment of the invention.

Clock separator 300 supports priority upgrading and also the three stage protocol. It includes an input and output interfaces as well as control path 310, data path 320 and a controller 330. The controller 330 controls the operation of the clock separator while the control path 30 is used to propagate transaction requests, control signals and attributes. These signals can include EOT signal, EOD signal, acknowledgement signals, transaction request signals and the like.

The controller 330 can receive indications about the mode of operation of the clock separator and control the clock separator 300 accordingly. For example, the clock separator can operate in a bypass mode during which the input clock frequency and the output clock frequency are the same, in various modes in which there is a predefined relationship between the input and output clocks and the like.

The data path 320 includes two sampling circuits for write operations and one sampling circuit for read operations. The data path 320 usually includes a buffer for write operations and a buffer for read operations. The buffering allows to compensate for differences between the input and output clock frequencies.

The dashed vertical line 301 illustrates that the clock separator 300 components operate at an input frequency domain and an output frequency domain. It is noted that the frequencies can differ from each other but this is not necessarily so. The clock separator 300 can be used to synchronize between input and output clocks, reduce skew and/or jitter and the like.

Figure 8:
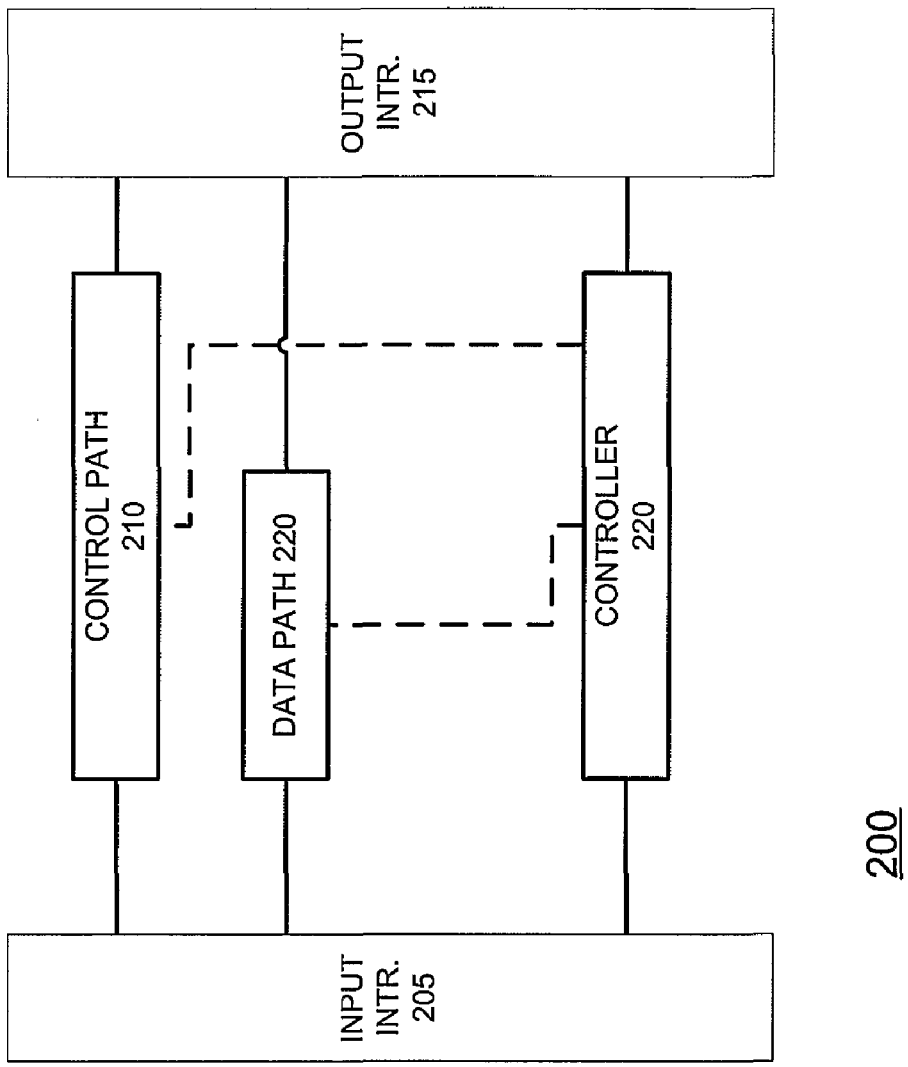
FIG. 8 illustrates a bus width adaptor, according to an embodiment of the invention.

FIG. 8 illustrates a bus width adaptor 400, according to an embodiment of the invention.

The bus width adaptor 400 supports priority upgrading and also the three stage protocol. It includes an input and output interfaces as well as control path 410, data path 420 and a controller 430. The controller 430 controls the operation of the bus width adaptor 400 while the control path 410 is used to propagate transaction requests, control signals and attributes. These signals can include EOT signal, EOD signal, acknowledgement signals, transaction request signals and the like.

The controller 430 can receive indications about the width of the different buses, alignment of data and timing parameters and control the bus width adaptor 400 accordingly. The data path 420 includes two sampling circuits for write operations and one sampling circuit for read operations. The data path 420 usually includes a buffer for write operations and a buffer for read operations. The buffering allows to compensate for differences between the input and output bus widths.

Figure 9:
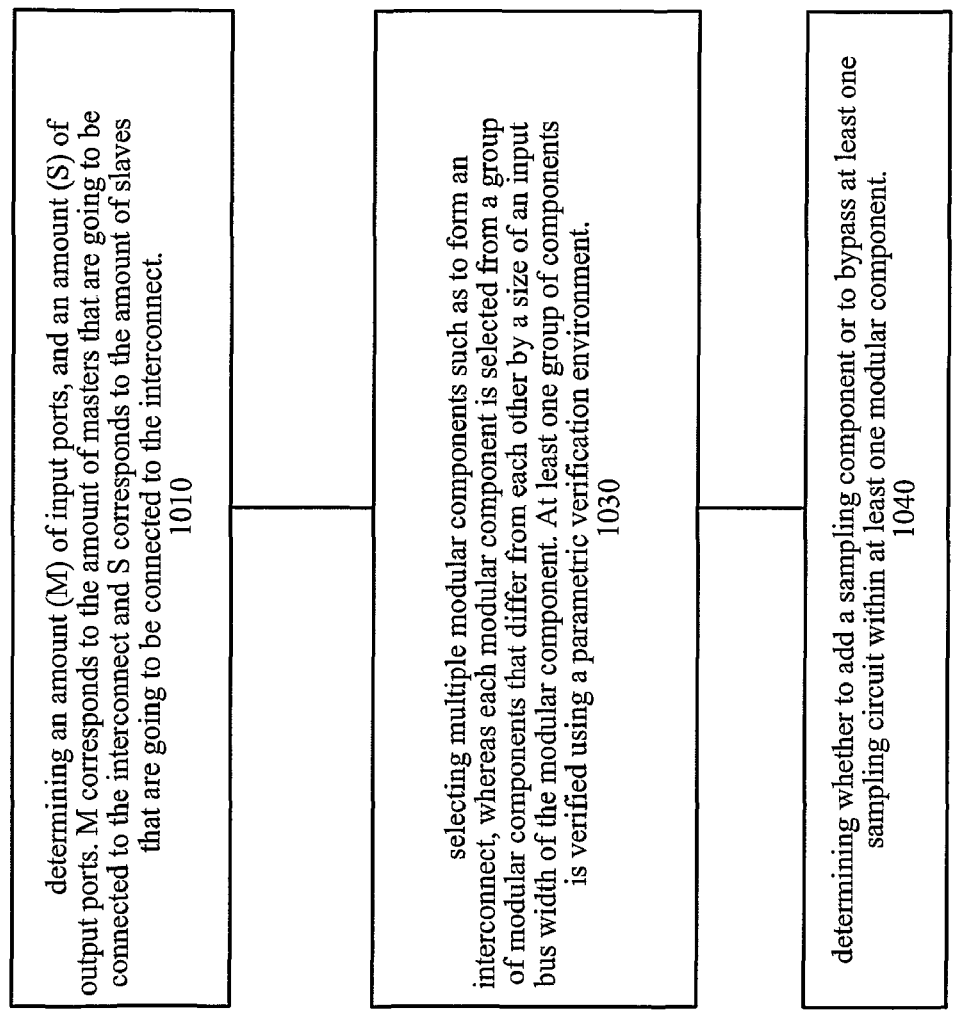
FIG. 9 illustrates a method for designing an interconnect, according to an embodiment of the invention.

FIG. 9 illustrates a method 1000 for designing an interconnect, according to an embodiment of the invention.

Method 1000 starts by stage 1010 of determining an amount (M) of input ports, and an amount (S) of output ports. M corresponds to the amount of masters that are going to be connected to the interconnect and S corresponds to the amount of slaves that are going to be connected to the interconnect.

Stage 1010 is followed by stage 1030 of selecting multiple modular components such as to form an interconnect, whereas each modular component is selected from a group of modular components that differ from each other by a size of an input bus width of the modular component. Conveniently, at least one group of components is verified using a parametric verification environment.

Stage 1030 is followed by stage 1040 of determining whether to add a modular sampling component or to bypass at least one sampling circuit within at least one modular component. Conveniently, stage 1040 is responsive to an expected interconnect latency value.

Conveniently, the selection includes selecting at least one sampler in response to an expected interconnect latency value. Conveniently, the selection includes selecting modular components that are adapted to support a certain point-to-point protocol. Conveniently, the selection includes selecting M expanders (600(1)-600(M)), whereas different expanders are connected to different masters, and wherein each expander is coupled in parallel to S arbiters and multiplexers.

Conveniently, the selection includes selecting S splitters, wherein each splitter is adapted to optimize transactions towards a slave associated with the splitter. Conveniently, the selection includes selecting clock separators and/or bus width adaptors. The selection is responsive to the clock frequency of the master and the clock frequency of the slave and to the bus width of the master and the bus width of the slave.

Figure 10:
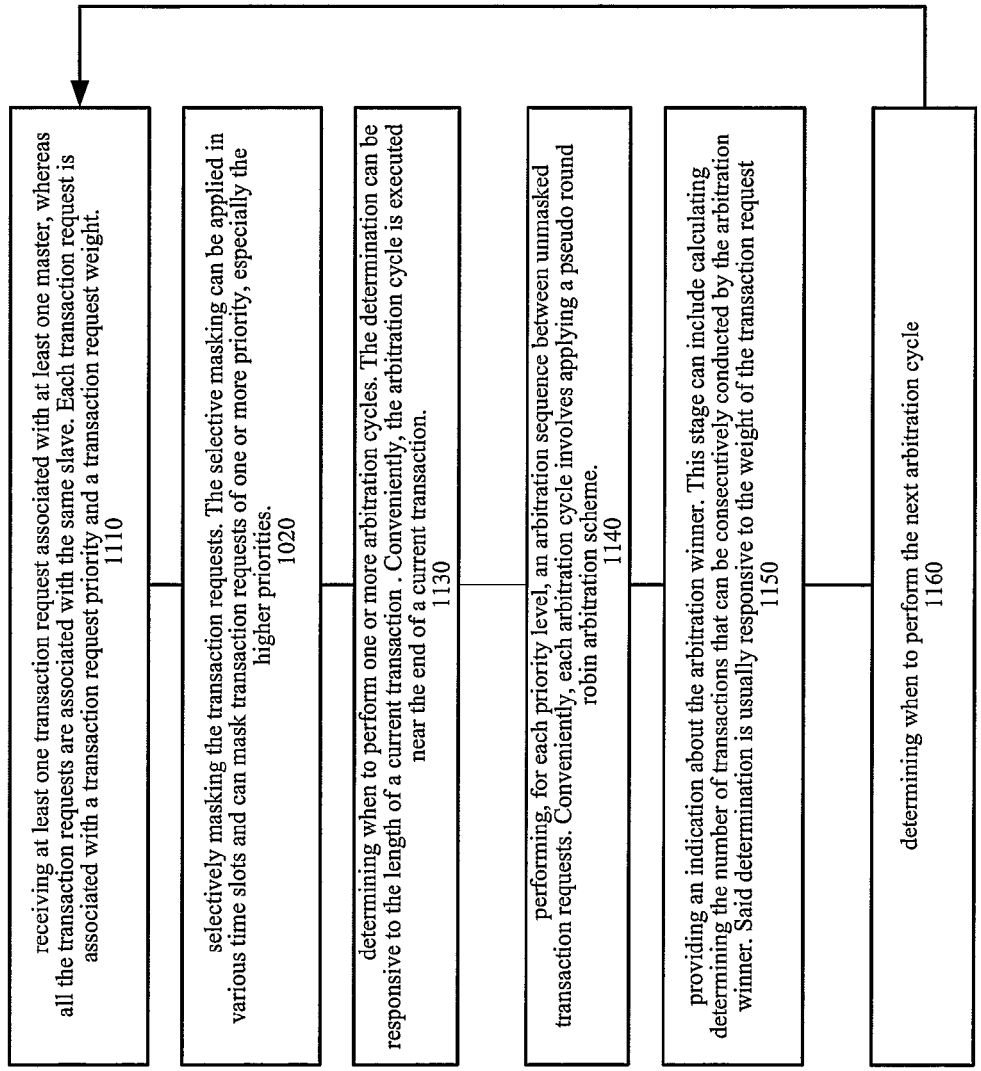
FIG. 10 illustrates an arbitration method, according to an embodiment of the invention.

FIG. 10 illustrates an arbitration method 1100, according to an embodiment of the invention.

The arbitration method 1100 starts by stage 1110 of receiving at least one transaction request associated with at least one master, whereas all the transaction requests are associated with the same slave. Each transaction request is associated with a transaction request priority and a transaction request weight.

Stage 1110 is followed by stage 1120 of selectively masking the transaction requests. The selective masking can be applied in various time slots and can mask transaction requests of one or more priority, especially the higher priorities.

Stage 1120 is followed by stage 1130 of determining when to perform one or more arbitration cycles. The determination can be responsive to the length of a current transaction. Conveniently, the arbitration cycle is executed near the end of the address phase of the current transaction. According to an embodiment of the invention there can be a time gap between the selection of an arbitration winner and the beginning of the data phase. This time gap usually occurs in read transaction, although this is not necessarily so. In write transactions the data to be transferred during the data phase is usually stored within interconnect when the arbitration takes place. In read transactions the data is usually stored within the slave when the arbitration cycle occurs. Thus, instead of waiting to the end of the data transfer in order to initiate the next arbitration cycle, the arbiter calculates the length of the currently approved data transfer and starts the next arbitration cycle after a delay that corresponds to that length.

Stage 1130 is followed by stage 1140 of performing, for each priority level, an arbitration sequence between unmasked transaction requests. Conveniently, each arbitration cycle involves applying a pseudo round robin arbitration scheme. Stage 1140 provides an arbitration winner and also include calculating the amount of data beats that can be transferred by the winner.

Stage 1140 is followed by stage 1150 of providing an indication about the arbitration winner. Stage 1150 can include determining the number of transactions that can be consecutively conducted by the arbitration winner. Said determination is usually responsive to the weight of the transaction request.

Stage 1150 is followed by stage 1160 of determining when to perform the next arbitration cycle and jumping to stage 1110. It is noted that if stage 1110 is preceded by stage 1160 then stage 1130 can be skipped. It is noted that the even of a certain master won an arbitration cycle and is in the middle of a sequence of transactions then the sequence can be stopped if a higher priority transaction request won an arbitration cycle.

Method 1100 also includes stage 1115 of updating the priority level of pending transaction requests. Stage 1115 can be executed during the execution of other stages of method 1100. Conveniently, a priority update of a certain transaction request is blocked once the transaction request wins the arbitration, but this is not necessarily so. Stage 1115 can be time based and/or can be initiated by a master. The priority upgrade can include upgrading the priorities of transaction requests that precede the certain transaction requests, especially those transaction requests that are stored at the same queue as the certain transaction request.

According to an embodiment of the invention the arbitration scheme is applied by a multiplexer and arbiter that participates in a three stage communication protocol. Conveniently, the arbiter and multiplexer is a modular component that can be connected to other modular components such as to form an interconnect.

Figure 11:
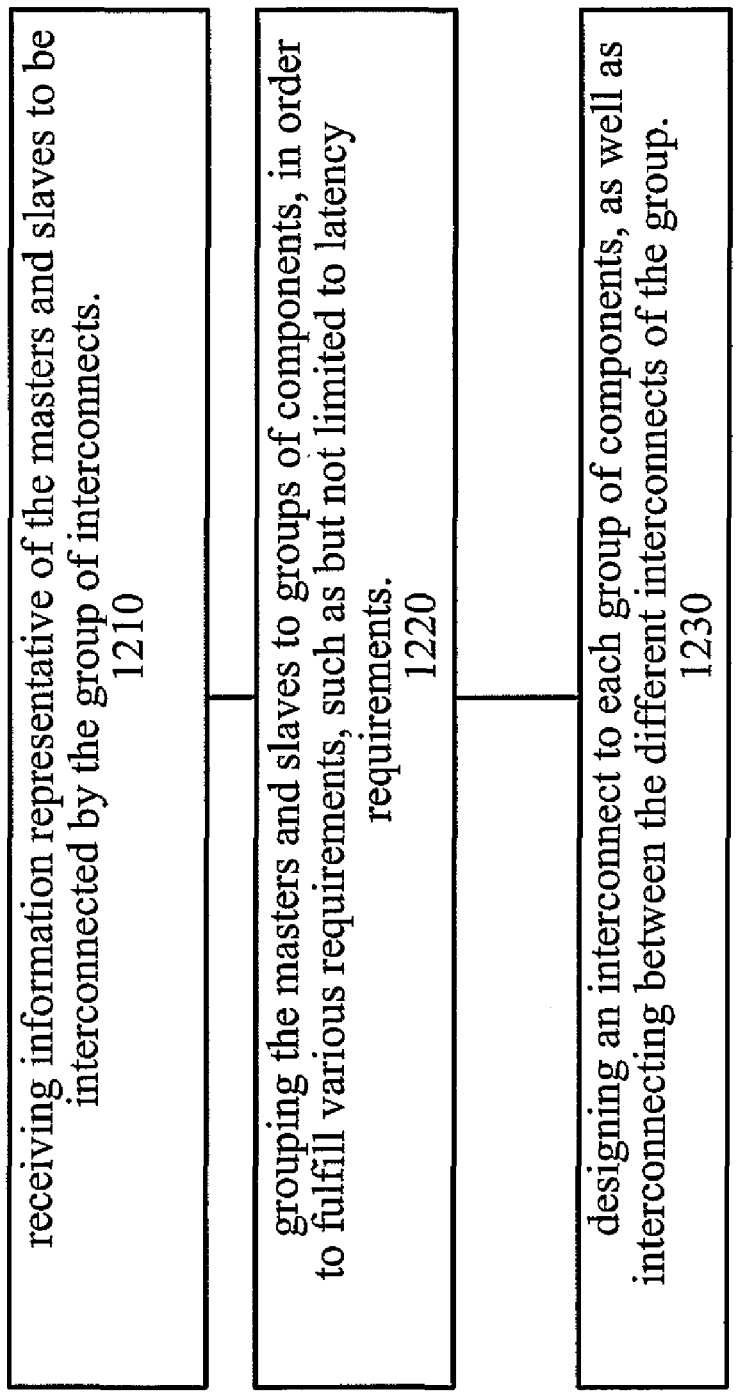
FIG. 11 illustrates a method for designing a group of interconnects, according to an embodiment of the invention.

FIG. 11 illustrates method 1200 for designing a group of interconnects, according to an embodiment of the invention.

Method 1200 starts by stage 1210 of receiving information representative of the masters and slaves to be interconnected by the group of interconnects.

Stage 1210 is followed by stage 1220 of grouping the masters and slaves to groups of components, in order to fulfill various requirements, such as but not limited to latency requirements.

Stage 1220 is followed by stage 1230 of designing an interconnect to each group of components, as well as interconnecting between the different interconnects of the group. Conveniently, a latency sensitive group of components is interconnected by a latency sensitive interconnect. Stage 1230 can include applying each stage of method 1000.

Figure 12:
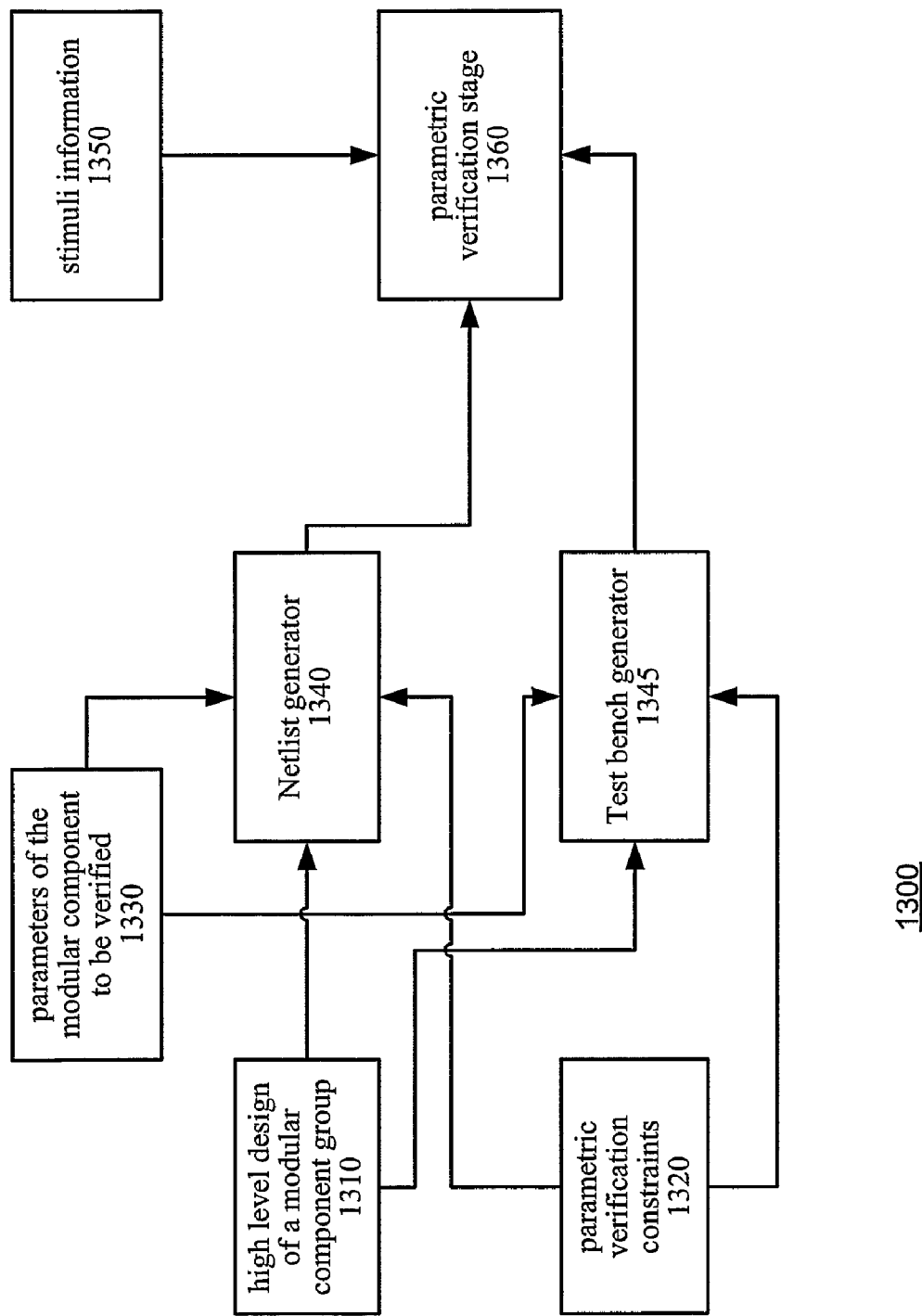
FIG. 12 illustrates a verification process, according to an embodiment of the invention.

FIG. 12 illustrates a verification process 1300, according to an embodiment of the invention.

The verification process 1300 starts by providing a high level design of the modular component group (box 1310), parametric verification constraints (box 1320) and the parameters of the modular component to be verified (box 1330) to a netlist generator (box 1340) and to a test bench generator (box 1345). The outputs of the netlist generator 1340 and the test bench generator 1345 are provided, along with stimuli information (box 1350) to a parametric verification stage (box 1360).

For example, the high level design of a group of splitters can be provided, where the bus widths can be provided as parameters. In other words the high level design can represent a family of splitters, by simply changing these parameters.

In addition verification constraints (box 1320) are provided.

According to an embodiment of the invention, for every new group of modular components, a parametric set of constraints, specification, cover sets and test patterns should be developed. The testing of the various modular components is done by using substantially the same stubs and monitors. The inspected modular design can be stimulated by random, pseudo-random or event driven stimuli.

Once the parametric verification environment is defined, the verification of a new modular component that has new parameters involves to provide the new parameters (box 1330) and to re-run the stimuli.

A typical parametric high level design includes loops that are iterated in response to the parameters. An exemplary high level design code that represents an address decodes is illustrated below:

```
// Address Decoders
   for ( i=0; i <=(`MEX_NOS-1); i = i +1 )
begin
      wire decoder i _hit;         // Hit in decoder # I
mex_<NOS>s_<MDBW>b_mex_start_end_decoder
#(`MEX_ADDR_DEC_WIDTH) target i _decoder (
         .ipm_addr(aptu_ipm_addr[35:36 −
`MEX_ADDR_DEC_WIDTH]),
         .start_addr(mci_decoder i
_start_addr[`MEX_ADDR_DEC_WIDTH − 1:0]),
         .end_addr(mci_decoder i
_end_addr[`MEX_ADDR_DEC_WIDTH − 1:0]),
               .enable(mci_decoder i _en),
               .hit(decoder i _hit)
               );
end // End of for loop
```

Figure 13:
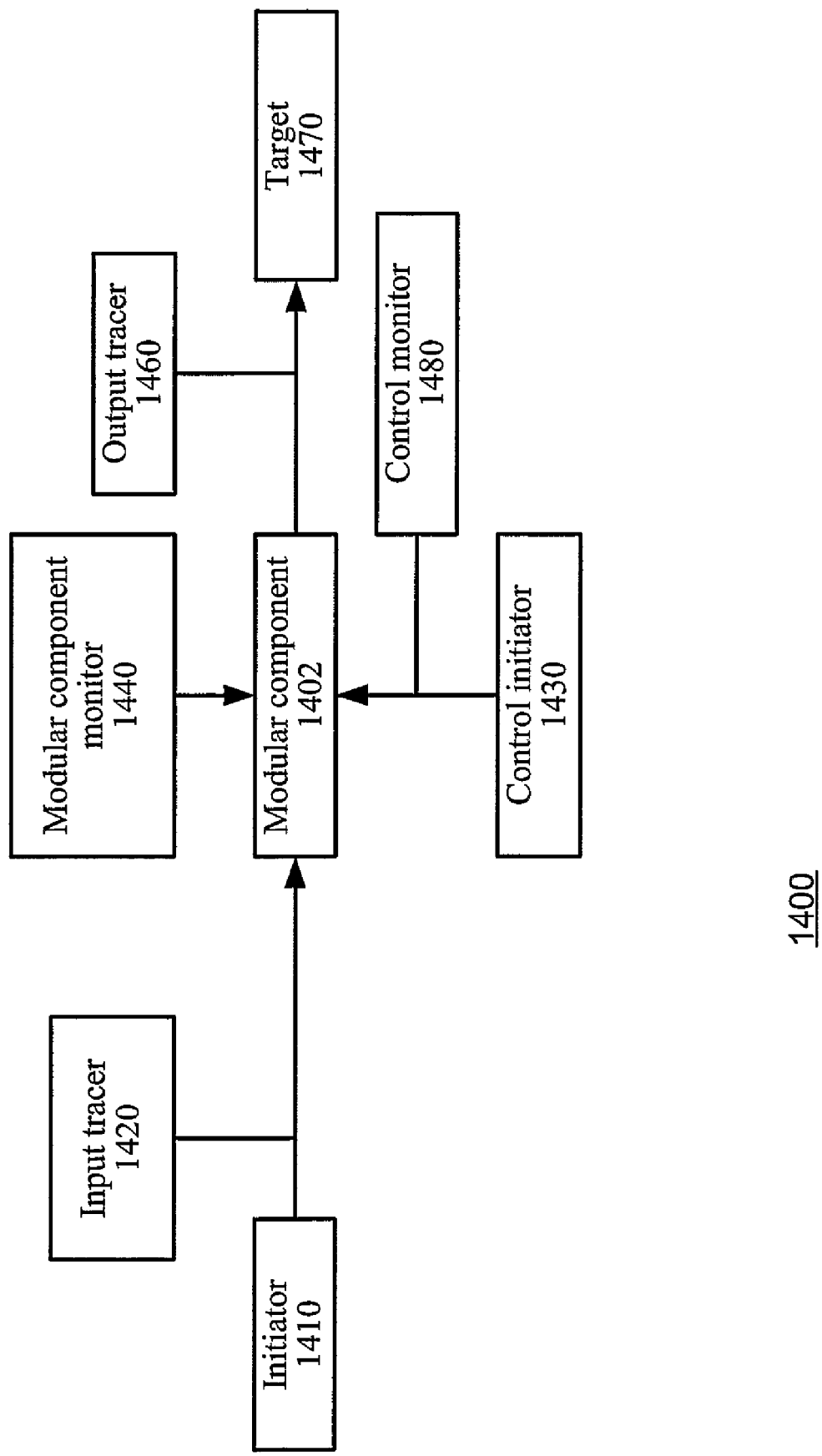
FIG. 13 illustrates a test bench, according to an embodiment of the invention.

FIG. 13 illustrates a test bench 1400, according to an embodiment of the invention.

Test bench can include multiple testing environments, but for convenience of explanation only a single testing environment is illustrated.

Test bench 1400 tests the operation of a modular component 1402. The test bench 1400 includes an initiators 1410 that provides stimuli to the modular component 1402. These initiators can be used for testing various modular components. Conveniently, the initiator 1410 can provide directed or random simulation.

Conveniently, the test bench is parametric in the following manners: (i) the stimuli should take into account the specific module interface, which is parametric (M, S, Data Bus Width) and drive it accordingly. Conveniently, the stimuli should cover the entire parameters range (verification space). (ii) The checker should be parametric, such that it will cover the entire verification range of parameters, (iii) the cover-set should be parametric, such that it will cover the entire verification space, (iv) The test-bench netlist should be flexible and allow instantiation of the appropriate numbers of initiators/targets stubs, checkers & monitors with the correct data bus width.

The stimuli is provided to the modular component 1402 and to an input tracer 1420. The output of the modular component 1402 is provided to a target 1450, and to an output tracer 1470. The modular component 1402 is also connected to a control monitor 1480 and to a control module 1430, for receiving control signals, and the like.

Conveniently, most of the tracers, monitors and targets can be used to test different modular components of the same modular component group or other modular component groups.

The amount of output monitors, tracers and targets is responsive to the amount of output ports of the modular component (for example one or S). The amount of initiators, and input tracers is responsive to the amount of input ports of the modular component (for example 1 or M).

Figure 14:
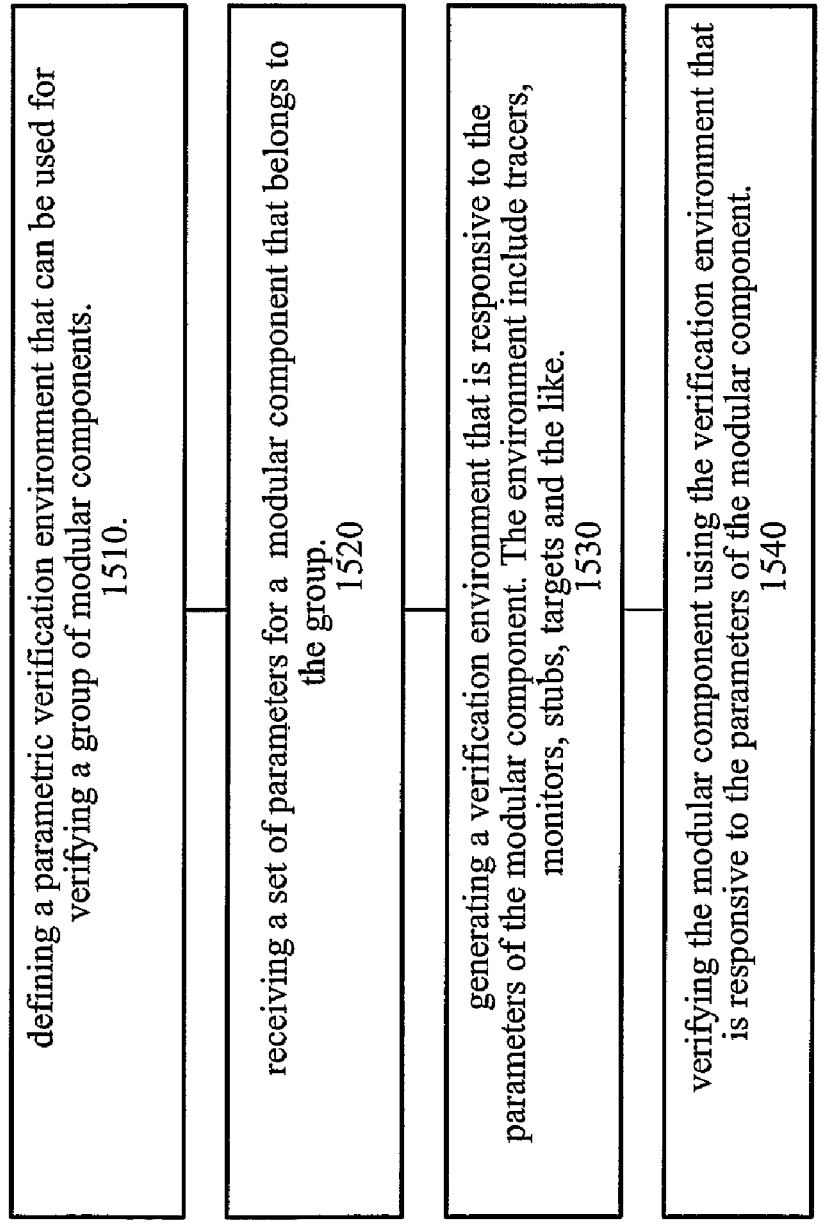
FIG. 14 illustrates a verification method, according to an embodiment of the invention.

FIG. 14 illustrates a verification method 1500, according to an embodiment of the invention.

Method 1500 starts by stage 1510 of defining a parametric verification environment that can be used for verifying a group of modular components.

For example: In order to have a verified Expander with S slaves and data bus width of DBW, the tests bench will generate a net-list which incorporates a single initiator stub, S target-stubs and S+1 standard monitors and checker, each with data-bus width of DEW. In addition, the test-bench will incorporate the expander checker with the above specified parameters. A single control stub and control monitor and checker will be placed.

Stage 1510 is followed by stage 1520 of receiving a set of parameters for a modular component that belongs to the group.

Stage 1520 is followed by stage 1530 of generating a verification environment that is responsive to the parameters of the modular component. The environment include tracers, monitors, initiator stubs, targets stubs and the like.

Stage 1530 is followed by stage 1540 of verifying the modular component using the verification environment of stage 1530.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. An interconnect comprising:
multiple (M) input ports;
multiple (S) output ports; and
multiple modular components coupled between the M input ports and the S output ports;
wherein each modular component is adapted to support a certain point-to-point protocol, wherein at least one modular component comprises a sampling circuit and a first bypass circuit, the sampling circuit being selectively bypassed by the first bypass circuit, the multiple modular components comprising;
multiple expanders, wherein each expander comprises:
a sampler, wherein the sampler upgrades a transaction priority of a pending transaction request stored in the sampler by changing a priority attribute value of the transaction request, the sampler being selectively bypassed by a second bypass circuit; and
a de-multiplexer; and
multiple (S) arbiters and multiplexers, wherein different expanders are coupled to different masters, and wherein each expander is coupled in parallel to the S arbiters and multiplexers.

2. The interconnect according to claim 1 wherein the selective bypass of the first bypass circuit and of the second bypass circuit is responsive to an expected latency value of the interconnect.

3. The interconnect according to claim 1 wherein the modular components further comprise S splitters, wherein each splitter is adapted to transact information towards a slave associated with the splitter in response to at least one slave transaction characteristic.

4. The interconnect according to claim 1 adapted to perform a priority upgrade that comprises upgrading a priority of a certain pending transaction request and upgrading priority attributes of other transaction requests that precede the certain transaction request.

5. The interconnect according to claim 1 wherein the modular, components further comprise clock separators.

6. The interconnect according to claim 1 wherein the modular components further comprise bus width adaptors.

7. The interconnect according to claim 1 wherein the interconnect is adapted to implement time based priority upgrading that involves increasing a priority of a pending transport request that is pending for more than a certain time threshold.

8. The interconnect according to claim 1 wherein the interconnect is synthesized within a bounded centralized area generating a star topology.

9. The interconnect according to claim 1 wherein the modular components are adapted to alter arbitration priority indications of pending transaction requests.

10. A method for designing an interconnect, the method comprises:
determining an amount of input ports, an amount of output ports;
selecting multiple modular components such as to form an interconnect, wherein each modular component is selected from a group of modular components that are verified by parametric verification environment, the multiple modular components comprising:
multiple arbiters and multiplexers; and
multiple expanders, wherein different expanders are coupled to different masters, and wherein each expander is coupled in parallel to S arbiters and multiplexers, and wherein each expander comprises a sampler and a de-multiplexer; and
selecting a main sampler that upgrades a transaction priority of pending transaction requests by changing priority attribute values of the pending transaction requests, the main sampler selectively bypassable by a first bypass circuit.

11. The method according to claim 10 further comprising determining whether to add a modular sampling component or to bypass at least one sampling circuit within at least one modular component; wherein the determining is responsive to an expected interconnect latency value.

12. The method according to claim 10 wherein the selecting further comprises selecting at least one sampler in response to an expected interconnect latency value.

13. The method according to claim 10 comprising selecting a modular component arranged to implement time based priority upgrading that involves increasing a priority of a pending transport request that is pending for more than a certain time threshold.

14. The method according to claim 10 wherein the selecting comprises selecting S splitters, wherein each splitter is adapted to optimize transactions towards a slave associated with the splitter.

15. The method according to claim 10 wherein the selecting comprises selecting clock separators.

16. The method according to claim 10 wherein the selecting comprises selecting bus width adaptors.

17. An interconnect comprising:
multiple (M) input ports;
multiple (S) output ports; and
multiple modular components coupled between the M input ports and the S output ports;
wherein each modular component is adapted to support a certain point-to-point protocol, the certain point to point protocol comprising a three phase protocol including a request and address phase, a data phase, and an end of transaction phase, wherein at least one modular component comprises a sampling circuit and a bypass circuit, the sampling circuit being selectively bypassed by the bypass circuit, the sampling circuit to upgrade a priority of a pending transaction request by changing a priority attribute value of the pending transaction request, the multiple modular components comprising;
multiple expanders; and
multiple (S) arbiters and multiplexers, wherein different expanders are coupled to different masters, and wherein each expander is coupled in parallel to the S arbiters and multiplexers;
wherein the interconnect is operable to locally terminate a transaction that is within the interconnect.

18. The interconnect according to claim 17 adapted to perform a priority upgrade that comprises upgrading a priority of a certain pending transaction request and upgrading priority attributes of other transaction requests that precede the certain transaction request.

19. The interconnect according to claim 1, wherein the multiple modular components comprise a first modular component supports a pending transaction request, wherein a transaction request that is associated with the pending transaction request is stored in a second modular component of the multiple modular components.

20. The method according to claim 10, wherein the multiple modular components further comprise a respective modular component that receives and generates signals that represent a beginning and an end of a phase for a transaction, wherein the phase includes an request and address phase, a data phase, and an end of transaction phase adapted to perform a priority upgrade that comprises upgrading a priority of a certain pending transaction request and upgrading priority attributes of other transaction requests that precede the certain transaction request.

* * * * *